United States Patent [19]

Oyama

[11] Patent Number: 5,115,559
[45] Date of Patent: May 26, 1992

[54] ELECTRONIC COMPONENT MOUNTING APPARATUS

[75] Inventor: Kenshu Oyama, Umi, Japan

[73] Assignee: Matsushita Electric Industrial Co., Ltd., Osaka, Japan

[21] Appl. No.: 578,307

[22] Filed: Sep. 6, 1990

[30] Foreign Application Priority Data

Sep. 6, 1989 [JP] Japan .............................. 1-230935

[51] Int. Cl.⁵ .............................................. H05K 13/04
[52] U.S. Cl. .................................... 29/720; 29/741; 29/833; 29/705
[58] Field of Search ................. 29/705, 740, 741, 720, 29/721, 833, 834–836

[56] References Cited

U.S. PATENT DOCUMENTS

| | | |
|---|---|---|
| 4,494,139 | 1/1985 | Shima et al. |
| 4,511,421 | 4/1985 | Kuehn et al. |
| 4,617,728 | 10/1986 | Andersen et al. |
| 4,649,635 | 3/1987 | Asai et al. |

FOREIGN PATENT DOCUMENTS

| | | | |
|---|---|---|---|
| 0062335 | 10/1982 | European Pat. Off. | |
| 0118689 | 9/1984 | European Pat. Off. | |
| 36799 | 12/1984 | European Pat. Off. | |
| 0189290 | 7/1986 | European Pat. Off. | |
| 60-171000 | 9/1985 | Japan | |
| 0251800 | 10/1989 | Japan | 29/740 |

*Primary Examiner*—Carl E. Hall
*Attorney, Agent, or Firm*—Wenderoth, Lind & Ponack

[57] ABSTRACT

A mounting apparatus for mounting electronic components, having a head having a pick-up nozzle mounted thereon for rotation in a direction Θ around an axis perpendicular to a component held on the nozzle and along a path between the delivery means and an X-axis and Y-axis table means; a motor connected to the mounting head for rotating the nozzle in the direction Θ; a recognition camera positioned along the path for recognizing positional deviations of an electronic component picked up by the nozzle and connected to motor and to the X-axis and Y-axis tables for roughly correcting the positional deviations of the component; a precise measuring unit mounted on the X-axis and Y-axis tables for precisely measuring the positions of leads on an electronic component held on the nozzle and being connected to the X-axis and Y-axis table drive for causing the X-axis and Y-axis tables to move in the X-axis and Y-axis directions in response to measuring results from the precise measuring means; a circuit board support pivotably mounted on X-axis and Y-axis tables for rotating around a pivotal axis parallel to the axis of rotation of the nozzle; and a horizontal rotating drive unit connected to the circuit board support and to which the precise measuring unit is connected for being moved to precisely adjust the position of a component in the Θ direction in response to measuring results from the precise measuring unit.

4 Claims, 4 Drawing Sheets

ELECTRONIC COMPONENT MOUNTING APPARATUS

BACKGROUND OF THE INVENTION

1. Field of the Invention

This invention relates to an apparatus for mounting an electronic component and, more particularly, to means for accurately mounting electronic components required to be mounted with high mounting accuracy such as a quad flat package (QFP) having leads extending in four directions.

2. Description of the Prior Art

There is known an electrode component mounting apparatus having a carrier turntable which is provided with a number of suction nozzles for electronic components positioned in a circumferential direction thereof (e.g., see FIG. 4 of Japanese Patent Application Laid-Open No. 60-171000). The electronic component mounting apparatus of this type picks up electronic components provided by an electronic component delivery unit by indexing rotational movements of the carrier turntable, and feeds and mounts the electronic components on a printed circuit board positioned on an X-axis table and a Y-axis table. This type of electronic component mounting apparatus is widely employed as a high speed mounting apparatus since it can mount three or more electronic components per second on a printed circuit board.

The position of the electronic component picked up by the suction nozzle may deviate from the desired position in X, Y and Θ directions. In order to mount the electronic component on the printed circuit board, this positional deviation must be corrected. In a conventional electronic component mounting apparatus, a recognition unit such as a CCD camera constituting part of a positional deviation correcting means is provided along the path of the electronic component as it is moved by the indexing rotation of the carrier turntable. The positional deviations of the electronic component in the directions X, Y and Θ are detected by the recognition unit. The positional deviation in the direction Θ (rotational direction) is corrected by rotating the suction nozzle in the direction Θ around its own axis, and the positional deviations in the directions X and y are corrected by driving the X-axis table and the Y-axis table to move the printed circuit board in the directions X and Y.

Recently, electronic components having leads such as QFP have been mounted on a printed circuit board. The electronic components having such leads are difficult to mount on the printed circuit board by the above-described carrier turntable type mounting apparatus for reasons described below.

(i) Recently, electronic components have been required for high density and high integration devices. This has resulted in an increase in the number of leads for such components, up to 200 or more. Therefore, the lateral width and pitch of the leads are extrafine (e.g., 0.5 mm or less). Thus, precise mounting accuracy on this order is required and depending upon the camera used as the recognition unit, it is extremely difficult to precisely observe the leads so as to achieve the required accuracy.

(ii) Electronic components having leads have become large in size, up to 5 cm or more on one side thereof. In order that the large-sized electronic component be within the visual field of the camera, the magnification of the camera must be reduced, but if the magnification is reduced, its observing accuracy is inevitably lowered.

(iii) The positional deviation in the Θ direction has been connected by rotating the nozzle through the angle Θ. However, since it is very difficult to precisely rotate the nozzle by means of a motor, the positional deviation in the Θ direction is very difficult to correct accurately.

For the reasons described above, capacitor chips, resistor chips, etc. requiring relatively low mounting accuracy can be mounted on a printed circuit board at high speed by the above described carrier turntable type mounting apparatus. However, electronic components having a large number of leads cannot be mounted on a printed circuit board by the carrier turntable type mounting apparatus, but must be separately mounted at a low speed by a single head type mounting apparatus as shown in FIG. 3 of Japanese Patent Application Laid-Open No. 60-171000.

Since an electronic component having a large number of leads, such as a QFP, must be mounted with high mounting accuracy, the electronic component must be mounted on the printed circuit board, separately from the capacitor chips, resistor chips, etc.. Accordingly the working efficiency is reduced. Since two types of mounting apparatuses, the carrier turntable type and the single head type, are provided and must be operated separately, facility costs are increased, and production management and maintenance management also require a great deal of labor.

SUMMARY OF THE INVENTION

Accordingly, it is an object of this invention to provide a carrier turntable type electronic component mounting apparatus which can accurately mount an electronic component having a large number of leads, such as a QFP, at a high speed.

In order to achieve this and other objects according to the present invention, a carrier turntable type electronic component mounting apparatus is provided with a recognition unit having a camera for observing the positional deviation of an electronic component picked up by the nozzle of a suction head of the carrier turntable, the camera being positioned along the path of an electronic component as it is moved to the printed circuit board positioned on an X-axis table and a Y-axis table from an electronic component delivery unit. A precise measuring unit is provided at the X-axis table and the Y-axis table for precisely measuring the positions of the leads of the electronic component while moving integrally with the X-axis table and Y-axis table in the directions X and Y. A horizontally rotating unit for horizontally rotating the printed circuit board positioned on the X-axis and Y-axis tables is also provided.

With the arrangement described above, the electronic component provided by the electronic component delivery unit is picked up by the nozzle of the suction head, the electronic component is fed past the recognition unit camera by the rotation of the carrier turntable, and the positional deviation of the electronic component is roughly observed by the camera. Then, this electronic component is fed to the X-axis and Y-axis tables. Therefore, the precise positional deviation of the lead is measured by the precise measuring unit while the X-axis and Y-axis tables are moved in the directions X and Y. Subsequently, the printed circuit board is moved and rotated in the directions X, Y and Θ to correct for the positional deviations in the directions Y, X and Θ, and the electronic component is then placed on the printed circuit board.

These and other objects and features of the present invention will become apparent from the following detailed description in conjunction with the attached drawings.

DESCRIPTION OF THE PREFERRED EMBODIMENT

An embodiment of an electronic component mounting apparatus according to the present invention will now be described with reference to the accompanying drawings.

Figure 1:
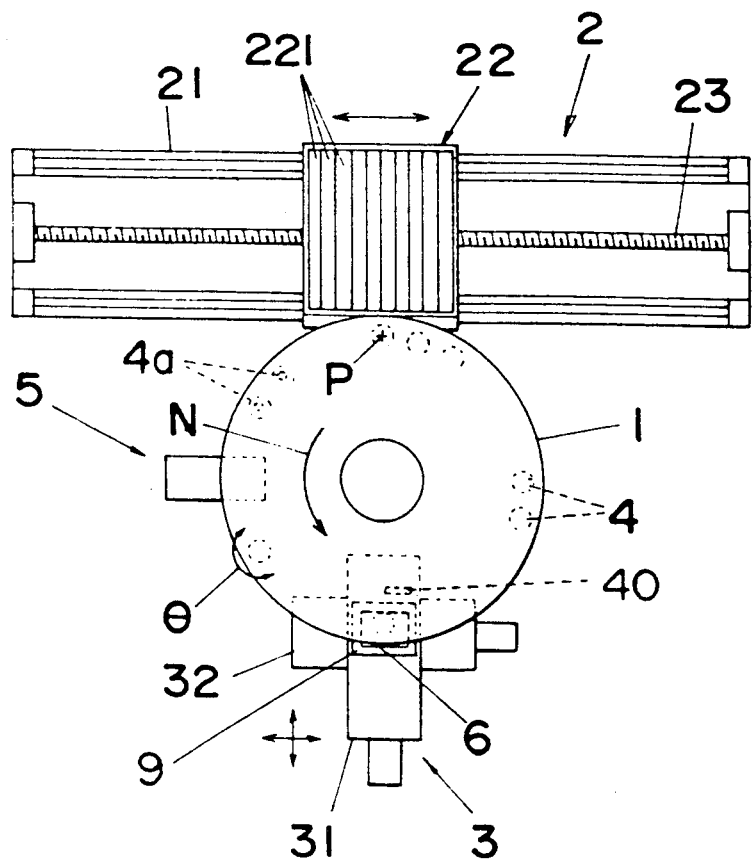
FIG. 1 is a plan view of an electronic component mounting means of a carrier turntable type electronic component mounting apparatus according to an embodiment of the present invention.
Figure 2:
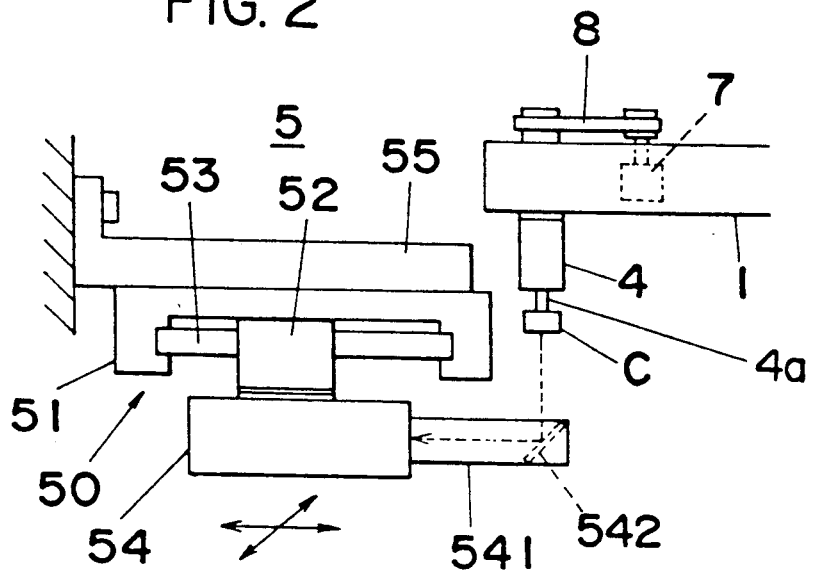
FIG. 2 is a side view of a recognition unit of the apparatus.
Figure 3:
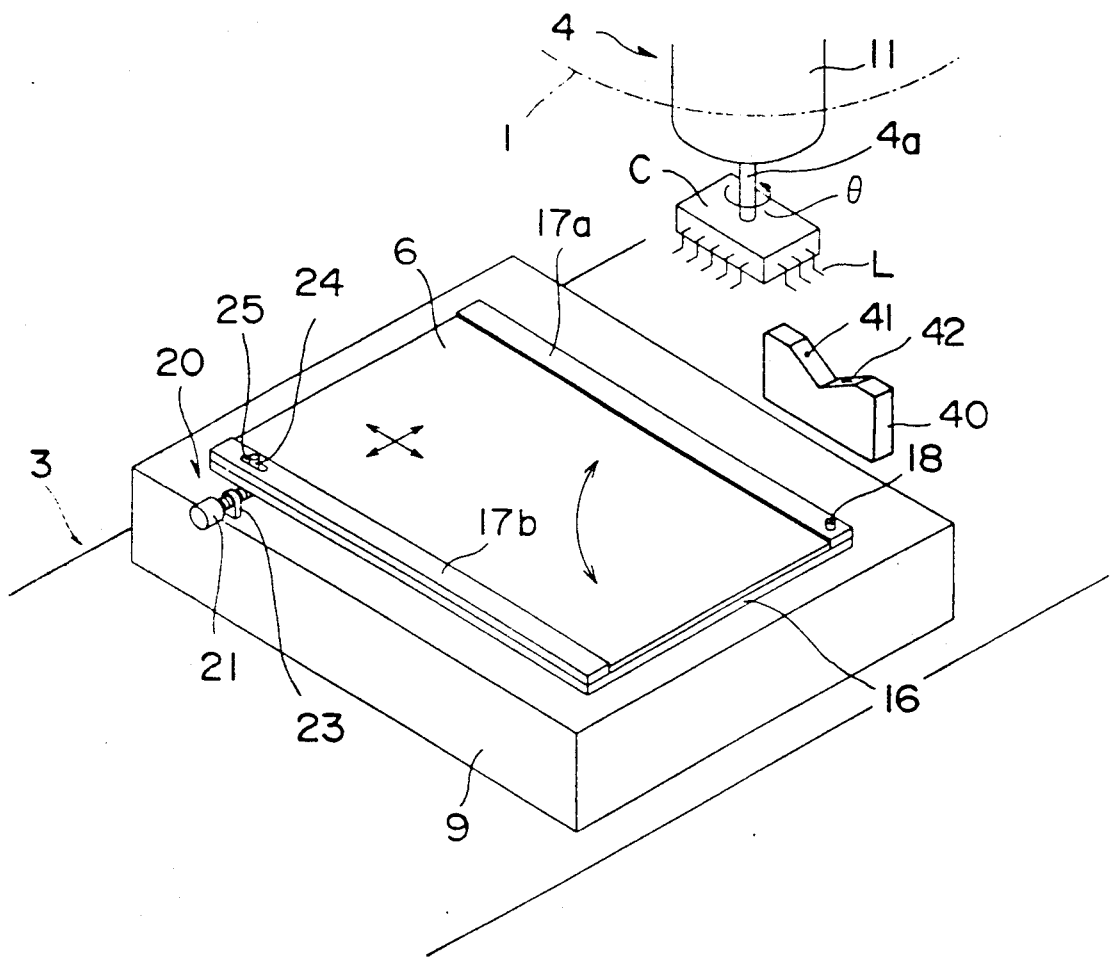
FIG. 3 is a perspective view of a horizontally rotating unit for a printed circuit board constituting part of the apparatus.

As shown in FIGS. 1-3, the electronic component mounting apparatus comprises a carrier turntable 1. An electronic component delivery unit 2 and X-axis and Y-axis tables 3 are disposed under the carrier turntable 1. Mounting heads 4 on the turntable 1 each have a nozzle 4a for picking up an electronic component by suction, and the mounting heads 4 are vertically suspended from the carrier turntable 1 and positioned in circumferential direction around the turntable. The mounting apparatus also comprises a recognition unit 5 for recognizing the electronic component picked up at the lower end of the nozzle 4a from below, and the recognition unit 5 is positioned along the path of an electronic component being carried between the delivery unit 2 and the X-axis and Y-axis tables 3.

The delivery unit 2 is composed of a supply unit 22 on the upper portion of a movable table 21. A feed screw 23 is rotated by a motor (not shown) to slide the supply unit 22 laterally and the position a desired electronic component at a takeup position P of a nozzle 4a. The supply unit 22 has a plurality of cassettes 221 in an electronic component sealing tape wound on a reel. The X-axis and Y-axis tables 3 are composed of an X-axis table 31 and a Y-axis table 32, and a printed circuit board 6 is positioned thereon.

The carrier turntable 1 is index-rotated in a counter-clockwise direction P where it picks up an electronic component, to a position over the X-axis and Y-axis tables 3 where an electronic component can be placed on the printed circuit board 6. The positional deviations of the electronic components in the directions X, Y and Θ are observed during said movement by the recognition unit 5. The indexing rotation is an intermittent rotation.

The recognition unit 5 has an X-axis and Y-axis moving unit 50 mounted on a supporting frame 51 for slidably moving an X-axis slide 52 and a Y-axis slide 53 in the directions X and Y, respectively, and a camera 54 is attached to the lower portion of the X-axis slide 52. The supporting frame is mounted on a mounting plate 55. A mirror barrel 541 of the camera 54 extends to a position below the path of the mounting heads 4 vertically suspended from the carrier turntable 1. The mirror barrel 541 has a reflecting mirror 542 thereon to reflect the image of an electronic component C held on the lower end of the nozzle 4a into camera 54. A Θ-direction rotating motor 7 is mounted in the carrier turntable 1 to rotate the nozzle 4a around its axis through an angle Θ by a belt 8 according to the result of the viewing by the camera 54 for making corrections in the Θ direction.

As described above, depending upon the camera 54, the leads of the electronic components cannot be precisely recognized. Further, as mentioned above, accurate rotation of the nozzle 4c for correction of deviation in the Θ-direction is very difficult.

FIG. 3 shows positioning means for the printed circuit board 6 on the X-axis and Y-axis tables 3. A table member 9 is provided on the X-axis and Y-axis tables 3, and a placing unit 16 for holding the printed circuit board 6 is disposed on the upper surface of the table member 9. Clamps 17a and 17b for clamping the printed circuit board 6 at both sides thereof to position it on the table member are provided at both sides of the placing unit 16. A corner of the placing unit 16 is pivotally supported by rotation on the table section 9 on a hinge 18.

Figure 4:
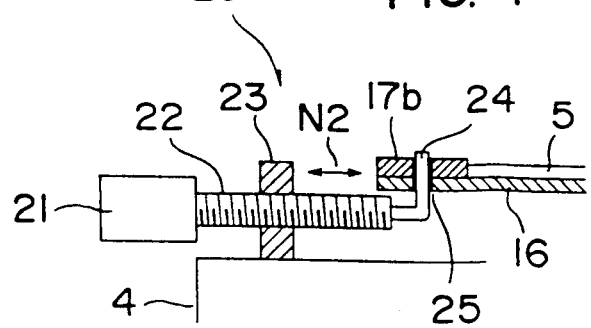
FIG. 4 is a cross-sectional view of the horizontally rotating unit of FIG. 3.
Figure 5:
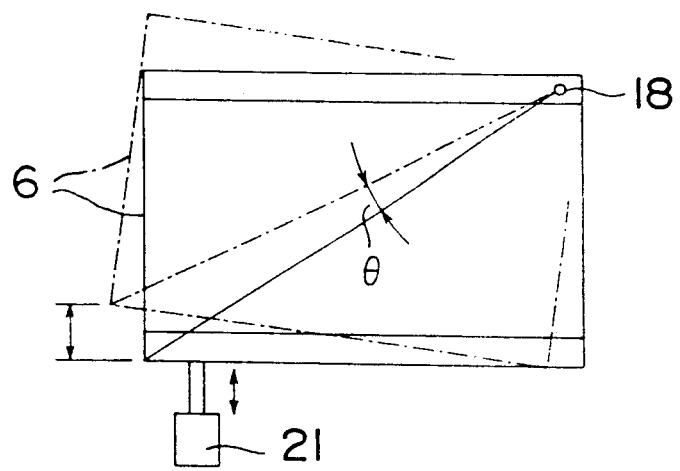
FIG. 5 is a plan view thereof.

FIG. 4 shows a driving unit 20 for horizontally rotating the placing unit 16. There are provided a motor 21, a feed screw 22, and a nut 23 provided on the table member 9. A hook type pin 24 extends from the end of the feed screw 22. The end of the pin 24 is engaged in an elongated hole 25 in the placing unit 16. Accordingly, when the motor 21 is driven, the feed screw 22 is reciprocated in the longitudinal direction N2, and the placing unit 16 is horizontally rotated around the hinge 18. FIG. 5 shows the horizontal rotation of the placing unit 16. More specifically, the placing unit 16, the hinge 18, and the driving unit 20 constitute a horizontally rotating unit for horizontally rotating the printed circuit board 6.

Figure 6:
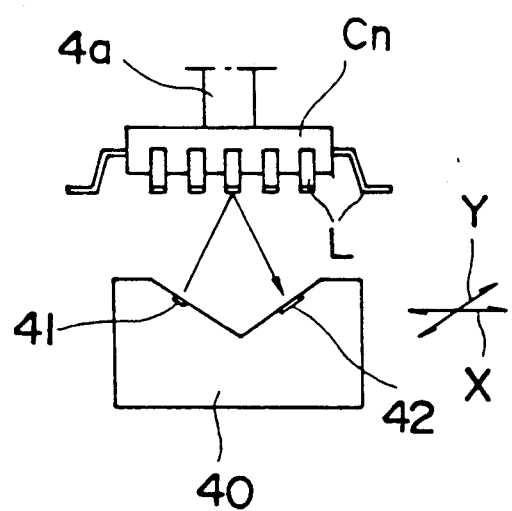
FIG. 6 is a front view of a laser unit.

As shown in FIGS. 3 and 6, a precise measuring unit 40 constituted by a laser unit is provided on the X-axis and Y-axis tables 3, and has a light emitting unit 41 for emitting a laser light, and a photodetector 42. The laser unit 40 emits the laser light toward the leads L of the electronic component C held by the nozzle 4a while the laser unit is moving in the directions X and Y integrally with the X-axis and Y-axis tables 3. Light reflected from the leads is received by the photodetector 42 thereby to precisely measure the position of the lead L. The detailed operation will be described later. The laser unit 40 can measure the positional deviation of the leads L more precisely than can the camera.

Figure 7:
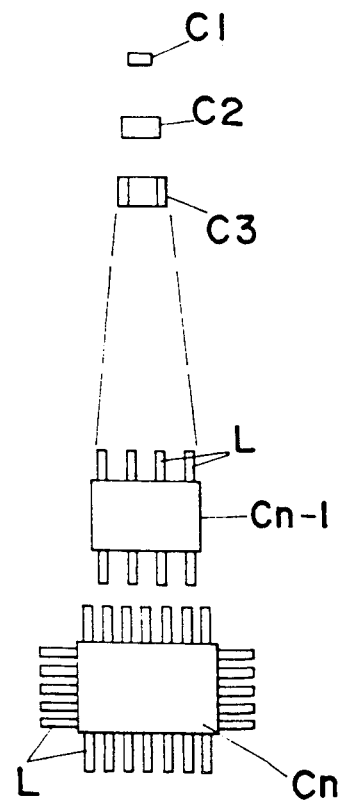
FIG. 7 is a plan view of large and small electronic components.

As shown in FIG. 7, the sizes and shapes of the electronic components C are varied, and there are resistor chips C1 and C2, and capacitor chips C3 of relatively small size, an electronic component Cn-1 such as a small outline package (SOP) having the leads L extending in two directions, and an electronic component Cn such as a QFP having closely spaced leads L extending in four directions. Among these components, the resistor chips C1 and C2 and the capacitor chips C3 generally require only low mounting accuracy. Since the electronic component Cn has a large number of extrafine leads L protruding therefrom, which must be accurately bonded through the leads L to the pattern of the printed circuit board 6, extremely high mounting accuracy is required. The mounting apparatus of the invention is for mounting various kinds of electronic components C1 to Cn on a printed circuit board 6 at a high speed while satisfying the required mounting accuracy. The mounting operations of the electronic components C1 to Cn will be described with reference to the drawings.

Figure 8:
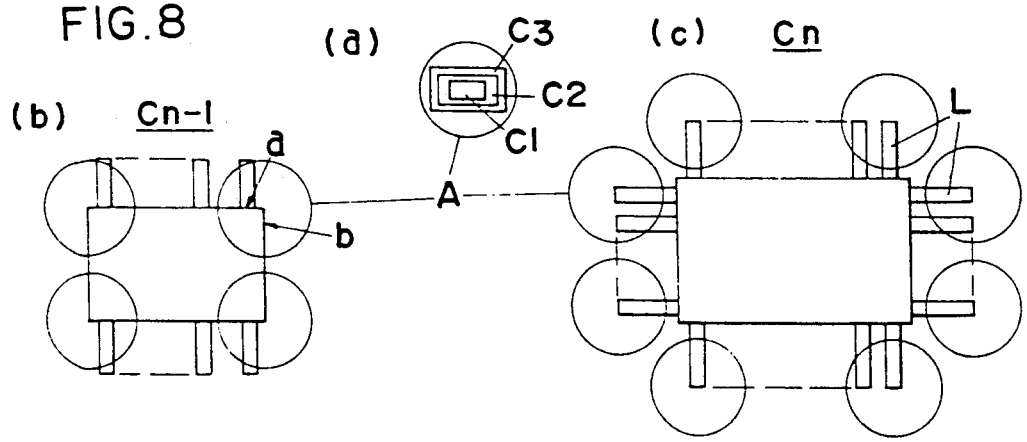
FIGS. 8(a), 8(b) and 8(c) are plan views showing the relationship of the visual field of the recognition camera and the components being mounted.

FIGS. 8a–8c show the manner of observing the electronic component through the recognition unit 5. In the case of relatively small electronic components C1 to C3, the required mounting accuracy is relatively low. Accordingly, as shown in FIG. 8(a), the entire electronic component is viewed within the visual field A of the camera 54 so that the positional deviations in the directions X, Y and Θ can be simultaneously observed. Then the electronic component is fed and placed on the printed circuit board 6 positioned in the X-axis and Y-axis tables 3 by the indexing rotation of the carrier turntable 1. The motor 7 is rotated during said feeding and placing so as to rotate the nozzle 4a through an angle Θ for correcting the positional deviation in the direction Θ. The positional deviations of the component in the directions X and Y are corrected by moving the X-axis and Y-axis tables 3 in the directions X and Y.

Thus, with respect to the electronic components C1 to C3 which only require low mounting accuracy, the positional deviations are recognized via the camera 54 and corrected in the same manner as in the conventional apparatus, and the positional deviation in the Θ direction is corrected by rotating the nozzle 4a through the correctional angle Θ, and the positional deviations in the X and Y directions are corrected by moving the X-axis and Y-axis tables.

The electronic components Cn-1 and Cn require a high mounting accuracy. If the magnification of the camera 54 is lowered to simultaneously observe the entire electronic component, observation errors are greatly increased. Therefore, in the case of the electronic component Cn-1, the X-axis and Y-axis moving unit 50 is driven to move the camera 54 in the directions X and Y thereby to introduce the corners of the electronic component Cn-1 into the visual field A (See FIG. 8(b).), so that the positional deviations of the orthogonal vertical and lateral sides a and b are detected thereby to detect the positional deviations of the electronic component Cn-1. Such a recognition can be conducted only at one corner of the electronic component Cn-1, since it takes a long time to detect the positional deviations of the four corners by driving the X-axis and Y-axis moving unit 50 to move the camera 54 in the X and Y directions, to all four corners. However, it is possible to more precisely detect the positional deviations and raise the mounting accuracy by viewing all four corners.

As shown in FIG. 8(c), in the case of an electronic component Cn having the leads L extending in the four directions, the leads L at the corners are introduced into the visual field A of the camera to be observed. Because the electronic component Cn having the leads extending in the four directions must be mounted with extremely high mounting accuracy, the mounting accuracy can be increased by observing as many leads as possible at eight positions, i.e., two at each of the corners.

As described above, the corners of the electronic component Cn-1 and the leads L at the corners of the component Cn are observed by moving the camera 54 in the directions X and Y, thereby making possible precise observations of the positional deviations in the directions X, Y and Θ. Nevertheless, the observations by the camera 54 are rough and detect only substantially accurate positions of the lead L sufficient to enable accurate positioning of the leads L at the laser emitting position of the laser unit 40.

Then, the electronic components Cn-1 or Cn are fed to the printed circuit board 6 on the X-axis and Y-axis tables 3 by the indexing rotation of the carrier turntable 1. It is difficult to accurately correct the positional deviations of the electronic component in the direction Θ by the motor 7 due to the performance of the motor 7. Therefore, a more accurate correction is executed as below.

When the electronic components Cn-1 or Cn are fed onto the X-axis and Y-axis tables 3, the laser unit 40 is moved under the lead L held by suction on the nozzle 4a. Then, laser light is emitted toward the leads L while moving the laser unit 40 in a traversing direction over the rows of the leads protruding from the sides of the electronic components Cn-1 or Cn, and the reflected light is received by the photodetector 42 thereby to accurately measure the positional deviation of the leads L (see FIG. 6). In the instant case, since the rough recognition of the positions of the electronic components Cn-1 or Cn has previously been made, the laser light is exactly focused onto the leads to measure the positional deviations thereof. Thereafter, the motor 21 is driven on the measured results to horizontally rotate the printed circuit board 6 so that the positional deviation of the leads L in the direction 8 is corrected, and the X-axis and Y-axis tables 3 are moved to correct the positional deviations in the directions X and Y, and the electronic components Cn-1 or Cn are then placed on the printed circuit board 6. The means for horizontally rotating the printed circuit board 6 can correct the deviations in the Θ direction more accurately than the means for Θ-rotating the nozzles 4a.

As described above, with regard to the electronic components C1 to C3 having lower mounting accuracy requirements, the present means recognizes the positional deviations of the electronic components in the directions X, Y, Θ by the camera 54, and corrects the positional deviation in the direction Θ by the motor 7 and then feeds and places them on the printed circuit board 6. In the case of the electronic components Cn-1 or Cn requiring high mounting accuracy, the rough recognition is carried out on the leads L through the camera 54 such that the leads L can be positioned at the position of the laser light from the laser unit 4d. Subsequently, the positions of leads L are precisely measured by the laser unit 40 to detect the positional deviations. In accordance with the detected results, the positional deviations in the Θ-direction are corrected by driving the horizontal rotation unit and horizontally rotating the printed circuit board 6. The electronic components C1 to C3 can be mounted at a high speed as in the conventional apparatus. Since the electronic components Cn-1 or Cn require some time for measuring by the laser unit 40, the mounting speed is slightly lowered as compared to the components C1 to C3, but the components can be mounted on the printed circuit board 6 with a high accuracy. As a precise measuring unit rather than the laser unit, there may be employed any other unit which can precisely measure position, such as a linear image sensor.

According to the present invention as described above, the electronic components having a low mounting accuracy requirement, such as resistor chips and capacitor chips can be mounted on the printed circuit board by detecting the positional deviation by the camera of the recognition unit and correcting the positional deviation in the Θ direction simply by the motor for rotating at the angle Θ. The electronic components with leads, such as SOP or QFP and having a high mounting accuracy requirement are accurately mounted on the printed circuit board by roughly correcting their position from the observations by the camera, and then precisely measuring the remaining positional deviation by the precise measuring unit, driving the horizontally rotating unit and the X-axis and Y-axis tables based on the results, and accurately correcting the positional deviations. Therefore, a wide variety of types of electronic components can be accurately mounted on the printed circuit board with satisfactory operation of the apparatus while satisfying the required mounting accuracies.

I claim:

1. A mounting apparatus for mounting electronic components, comprising:

means for delivering electronic components;

X-axis and Y-axis table means movable in the X-axis and Y-axis directions for adjusting the position of a printed circuit board supported thereon, and means for moving said X-axis and Y-axis table means in X and Y directions respectively;

a carrier mounted between said delivering means and said X-axis and Y-axis table means and having a mounting head thereon, said head having a pick-up nozzle mounted thereon for rotation in a direction Θ around an axis perpendicular to a component held on said nozzle, and means for moving said carrier to move said mounting head along a path between said delivery means and said X-axis and Y-axis table means;

a motor connected to said mounting head for rotating said nozzle in the direction Θ, said nozzle picking up electronic components from said delivery means, being moved so as to feed the electronic components along said path and mounting the electronic components onto the printed circuit board;

recognition means including a camera positioned along said path for recognizing positional deviations of an electronic component picked up by said nozzle in the X, Y and Θ directions and connected to said motor and to said X-axis and Y-axis table means for roughly correcting the positional deviations of the component;

precise measuring means mounted on said X-axis and Y-axis table means for precisely measuring the positions of leads on an electronic component held on said nozzle, said precise measuring means being connected to said X-axis and Y-axis table means moving means for causing said X-axis and Y-axis table means to move in the X-axis and Y-axis directions in response to measuring results from said precise measuring means;

circuit board supporting means pivotably mounted on said X-axis and Y-axis table means for rotating around a pivotal axis parallel to the axis of rotation of said nozzle; and horizontal rotating means connected to said circuit board supporting means and to which said precise measuring means is connected for being moved to precisely adjust the position of a component in the Θ direction in response to measuring results from said precise measuring means.

2. An electronic component mounting apparatus as claimed in claim 1 in which said precise measuring means is a laser unit.

3. An electronic component mounting apparatus as claimed in claim 1 in which said precise measuring means is a linear image sensor.

4. An electronic component mounting apparatus as claimed in claim 1 further comprising an X-axis and Y-axis moving unit on which said recognizing means is mounted for moving said camera to enable said camera to view different portions of large components.

* * * * *